United States Patent
Variyam et al.

(10) Patent No.: US 6,531,972 B2
(45) Date of Patent: Mar. 11, 2003

(54) APPARATUS AND METHOD INCLUDING AN EFFICIENT DATA TRANSFER FOR ANALOG TO DIGITAL CONVERTER TESTING

(75) Inventors: Pramodchandran Variyam, Richardson, TX (US); Sumant Bapat, Westlake Village, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/838,072

(22) Filed: Apr. 19, 2001

(65) Prior Publication Data

US 2001/0035834 A1 Nov. 1, 2001

Related U.S. Application Data

(60) Provisional application No. 60/198,877, filed on Apr. 19, 2000.

(51) Int. Cl.[7] .................................................. H03M 1/10
(52) U.S. Cl. ........................ 341/120; 341/118; 341/155; 702/57; 702/58; 702/59; 702/64; 702/65; 702/126; 702/186; 702/188; 714/735
(58) Field of Search ................................. 341/118, 120, 341/155; 324/5; 702/57–59, 64–65, 117–127, 182–185, 188, 189; 714/735

(56) References Cited

U.S. PATENT DOCUMENTS

| 3,648,175 A | * | 3/1972 | Barnard et al. ............. 324/115 |
| 4,354,177 A | | 10/1982 | Sloane ....................... 340/347 |
| 5,771,012 A | | 6/1998 | Shu et al. ................... 341/118 |
| 5,793,642 A | | 8/1998 | Frisch ........................ 364/490 |
| 5,854,598 A | * | 12/1998 | De Vries et al. ............ 341/120 |
| 5,861,826 A | | 1/1999 | Shu et al. ................... 341/120 |
| 5,910,895 A | | 6/1999 | Proskauer et al. ..... 364/468.28 |

* cited by examiner

Primary Examiner—Michael Tokar
Assistant Examiner—Linh Van Nguyen
(74) Attorney, Agent, or Firm—April M. Mosby; Wade James Brady, III; Frederick J. Telecky, Jr.

(57) ABSTRACT

The test system and method described herein reduces the production test time of semiconductor devices. More specifically, the apparatus method in accordance with the present invention reduces the data transfer time between the test body and the test mainframe. The test system includes a workstation, a handling device, a test body and a test mainframe. A communication channel links the workstation, the handling device, the test body and the test mainframe together for transferring control signals and data. The test mainframe sends control signals to the test body to send a m-bit packet of least significant bits for each n-bit code word, where m is proportional to the noise amplitude inherent in the system in terms of least significant bits. In the alternative, a user at the workstation can send control signals to the test body to send a m-bit packet for each n-bit code word. The test mainframe calculates the number of m-bit packets that can simultaneously be transferred over the communications channel to the test mainframe. Once the test mainframe captures this data, the test mainframe regenerates the original n-bit code word from this m-bit packetized data by determining an offset value to add to each m-bit packet to sum to the value of the original n-bit code word. The test mainframe further processes n-bit code words to determine whether the device passes a predetermined criteria of operability.

14 Claims, 5 Drawing Sheets

APPARATUS AND METHOD INCLUDING AN EFFICIENT DATA TRANSFER FOR ANALOG TO DIGITAL CONVERTER TESTING

This applciation claims the benefit of Provisional application Ser. No. 60/198,877, filed Apr. 19, 2000.

FIELD OF THE INVENTION

The present invention relates to analog-to-digital converter testing and, more particularly, to an apparatus and method having an efficient data transfer scheme.

BACKGROUND OF THE INVENTION

During production, analog-to-digital converters (ADCs) are tested by checking whether various performance parameters of the ADC or device under test meet respective specifications. Two commonly measured performance parameters of ADCs during production testing are differential nonlinearity (DNL) and integral nonlinearity (INL). Various ways of measuring these performance parameters are described in "Linearity testing issues of analog to digital converters," T. Kuyel, IEEE International Test Conference, pp. 747–756, 1999 which is incorporated by reference herein.

The fastest known method for testing embedded analog to digital converters (ADCs) is the histogram-testing method which refers to a method of collecting multiple data points per code step and then calculating INL, DNL, and code transitions. It is described in "Tutorial DSP-Based Testing of Analog and Mixed-signal Circuits," M. Mahoney, (1987) which is incorporated by reference herein.

A typical test flow includes an analog level forced to an ADC input. The input signal, a voltage which increases linearly in time from a given minimum value to a given maximum value, is applied. The ADC takes a sample of the input signal at given instants and converts the sample into a code word on the outputs of the converter. The time, $\Delta t$, elapsing between two successive samples determines how often the ADC takes a sample of the input signal in conformity with the sampling frequency, $f_{sample}=1/\Delta t$. In order to achieve accurate testing of the ADC with respect to the DNL and the INL, the number of samples per code word should be sufficiently large. A practical example involves the testing of a 12-bit ADC with a sampling frequency $f_{sample}$ of 400 KHz, the tester being arranged to take 64 samples per code word. Generally, the outputs of the ADC generate a signal which increases linearly in time in discrete steps, following the input signal. Each discrete step yields a digital code word.

Due to imperfections of ADCs, the output signal deviates from the ideal output signal. Measurement of the signal by a tester offers a characterization of the quality of the ADC. The width of the steps is a measure of the relevant DNL of the ADC. A further parameter, the INL represents the difference between the expected transition point of the outputs and the actual transition point. The INL for a given point can also be determined by summing the individual values of the DNL per step up to the relevant point. The measurement is also suitable for determining the offset of the ADC by measuring the width of the first step, step 000, by determining the voltage when the converter outputs the first code word larger than 0.

A conventional automatic test system for testing semiconductors includes a workstation, a handling device, a test body and a test mainframe. The test mainframe includes at least one sequencer control module and a digital mainframe board having a digital pattern memory. The handling device is coupled to the workstation. At the workstation, a user can provide a pattern file to be stored in the digital pattern memory. The sequencer control module coupled with the digital pattern memory and clocking information provides the control signals to the test body for controlling a sequence of vectors applied to the device under test. In addition, it provides control signals received by the handling device for maneuvering the device under test to come in direct contact with the test probes located on the test body. The device under test, such as an analog-to-digital converter, responsive to the sequence of vectors generates n-bit code word outputs for each test signal. These code words are stored in a digital capture memory located in the test body. A communication channel links the workstation, the handling device, the test body and the test mainframe together for transferring control signals and data. The test mainframe sends control signals to the test body to send each n-bit code word corresponding to each test signal sample. The data is processed in a digital signal processor residing in the test mainframe to build a histogram and to calculate both the DNL and INL for the device under test. This entire process is repeated for thousands of conversions. The data accumulated from each conversion is used to determine whether the device under test has met pre-determined criteria for functionality.

In many commercial testers, transferring data from the digital capture memory to the tester memory is a very slow process. Moreover, the histogram testing method requires that hundreds of codes and thousands of conversions be collected to obtain reasonably accurate results which further aggravates the memory transfer problem. Often memory transfer accounts for more than 50% of the DNL and INL test time. For example, to estimate the DNL and INL of a 12-bit ADC with 400K samples per second conversion rate, 95000 samples must be transferred from digital capture memory to the tester memory. The memory transfer time for the 95000 samples is 198 ms on an Advanced Mixed-Signal Test System such as the model A580 sold by TERADYNE®, Inc. If the INL and DNL tests are to be performed at three different supply voltages, the overall memory transfer time will be 594 ms. Assuming 5 cents per second test cost, this translates to a test cost of approximately 3 cents per device. Such high test cost for merely transferring data is unacceptable for large volume production testing.

In addition, an increased level of resolution of an ADC results in an increase in the number of transition levels to be measured and imposes greater demands on the accuracy of these measurements of INL and DNL. The measurement time required to achieve this level of accuracy will thus increase by a factor of four for each additional bit. As a result, the total time required to exhaustively test an ADC will increase by a factor of eight for each additional bit of resolution.

In an alternate approach, known as hardware histograming, a field programming gate array (FPGA) is attached to a device interface board (DIB). The FPGA is programmed to generate a histogram. The histogram data is stored in a memory chip such as a static random access memory (SRAM) on the DIB. The histogram data is much smaller in comparison to the ADC output data. Hence, it can be transferred to the tester memory very fast. Although this technique reduces the data transfer time, it has several draw backs. First, synchronizing all the added hardware components like FPGAs, SRAMs etc. with the tester and the device under test is an arduous task. Incorporating such a technique to the current production testing will require extensive engineering time. Second, the additional hardware components added on to the test circuitry are prone to failures. Hence additional test codes must be written and frequently executed for verifying the functionality of the added test hardware.

Another approach is defined in U.S. Pat. No. 5,854,598, filed Oct. 4, 1996, by De Vries et. al., which is incorporated by reference herein. The method taught includes a step of reconstructing the relevant code word on the basis of the number of least-significant bits of the relevant code word and the value of the test signal corresponding to the relevant code word. This method and apparatus, however, necessitates the addition of a low-pass filter to eliminate the toggling of the least significant bit due to noise inherent in the system by passing the signal of this bit through the low-pass filter. This solution adds a delay to the testing sequence which is undesirable. More importantly, the post filtering solution provides an inaccurate translation of the relevant code word at the region where the toggling of the least significant bit arises due to noise. Thus, DNL and INL calculated using the reconstructed code word according to this approach will be inaccurate in the presence of noise. Although this approach may give sufficiently accurate DNL and INL for an approximate evaluation of embedded ADCs within large systems, it cannot be used for production testing of stand-alone ADCs. Stand-alone ADCs, such as those sold as catalog products, require accurate measurement of DNL and INL during production testing.

For the foregoing reasons, there is an urgency for development of an efficient memory transfer technique for ADC testing which increases the speed of data transfer from the digital capture memory to the tester memory. This new technique, however, should not require extensive modification to the existing test flow so that the engineering cost in implementing the modification is minimal.

SUMMARY OF THE INVENTION

The testing system and method described herein reduces the production test time of analog to digital converters (ADCs). More specifically, the apparatus method in accordance with the present invention reduces the data transfer time between the digital capture memory located in the test body and the tester memory located in the test mainframe. The test system includes a workstation, a handling device, a test body and a test mainframe. The handling device is coupled to the workstation and test mainframe. A user may supply through the workstation input to trigger the test mainframe to provide control signals to the test body such that a sequence of vectors are applied to the device under test. In addition, control signals may be sent to the handling device for maneuvering the device under test to come in direct contact with the test probes located on the test body. The device under test, in particular, an analog-to-digital converter, responsive to the sequence of vectors generates n-bit code word outputs for each test signal.

A communication channel links the workstation, the handling device, the test body and the test mainframe together for transferring control signals and data. The test mainframe sends control signals to the test body to send a m-bit packet of least significant bits for each n-bit code word, where m is less than n. In the alternative, a user at the workstation can activate the sequencer control module to send control signals to the test body to send a m-bit packet for each n-bit code word where m is proportional to the noise amplitude inherent in the system in terms of least significant bits. The test mainframe calculates the number of m-bit packets that can simultaneously be transferred over the communications channel to the test mainframe. Once the test mainframe captures this data in a test memory, the test mainframe regenerates the original n-bit code word from this m-bit packetized data by determining an offset value to add to each m-bit packet to sum to the value of the original n-bit code word. The test mainframe further processes n-bit code words to determine whether the device passes a predetermined criteria of operability.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1:
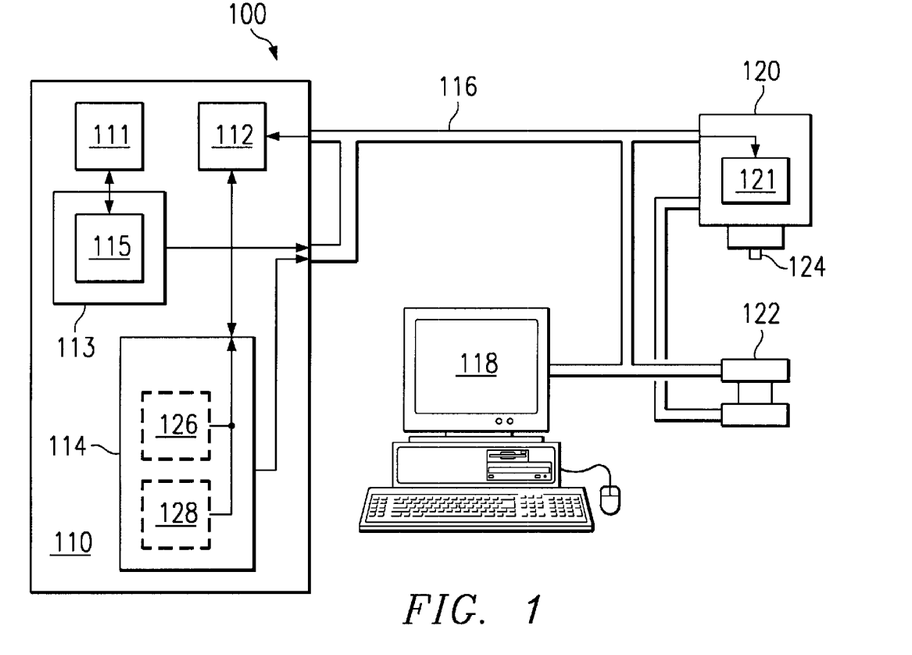
FIG. 1 is a known histogram-based test setup.

The present invention can be better understood by comparison with the a known an automatic test system as shown in FIG. 1. The automatic test system 100 tests a semiconductor or device under test (not shown). Conventional automatic test systems generally include a test mainframe 110 having a tester memory 112 and a processing unit 114, a communications channel 116, a computerized work station 118, a test body 120 and a handling device 122. The test mainframe 110 includes at least one sequencer control module 111 and a digital mainframe board 113 having a digital pattern memory 115. The handling device 122 is coupled to the workstation 118. At the workstation 118, a user can provide a pattern file to be stored in the digital pattern memory 115. The sequencer control module 111 coupled with the digital pattern memory 115 and clocking information provides control signals to the test body 120 for controlling a sequence of vectors applied to the device under test (not shown). In addition, sequencer control module 111 provides control signals transferred to the handling device 122 for maneuvering the device under test to come in direct contact with the test probes 124 located on the test body 120.

The control signals are usually digital values sent over communications channel 116. These control signals configure the hardware within test body 120 to make the measurements required for the test. The hardware within the test body 120 provides stimulus and measures responses from the device under test in accordance with the control signals.

The control signals also configure the hardware in the test body 120 to send the appropriate amount of bits to the test mainframe 110. The communication channel 116 connects the workstation 118, the handling device 122, the test body 120 and the test mainframe 110.

The device under test, such as an analog-to-digital converter, responsive to the sequence of vectors generates n-bit code word outputs for each test signal which is stored in a digital capture memory 121 located in the test body 120. The sequence control module 111 sends control signals to the test body 120 to send each n-bit code word corresponding to each test signal sample. The data is stored in test memory 112 and processed in a processor 114 residing in the test mainframe 110 to build a histogram and to calculate both the DNL and INL for the device under test. This entire process is repeated for thousands of conversions. The data accumulated from each conversion is used to determine whether the device under test has met pre-determined criteria for functionality.

An embodiment of a test system in accordance with the present invention modifies the pattern file stored in the digital pattern data memory 115 such that the sequencer control module 111 sends control signals to the test body 120 to send a m-bit packet of least significant bits for each n-bit code word to the tester memory 112. In the alternative, a user at the workstation 118 can send control signals through the sequencer control module 111 to the test body 120 to send a m-bit packet for each n-bit code word to the tester memory 112. The sequencer control module 111 calculates the number of m-bit packets that can simultaneously be transferred over the communications channel 116 to the test mainframe 110. The m-bit packets are captured in the tester memory 112. The processing unit 114 retrieves the m-bit packets and regenerates the original n-bit code word from each m-bit packet by determining an offset value to add to each m-bit packet to sum to the value of the original n-bit code word. The processing unit 114 further processes the data to determine whether the device passes a predetermined criteria of operability.

Another embodiment of a test system in accordance with the present invention may include a processing unit 114 comprising a tester central processing unit 126 and a digital signal processor (DSP) 128. The tester central processing unit 126 may comprise a set of instructions to determine the offset value to add to each m-bit packet to sum to the value of the original n-bit code word. In the alternative, the DSP 128 may include the functionality of determining the offset value to add to each m-bit packet to sum to the value of the original n-bit code word. Since a DSP 128 is generally much faster that a central processing unit 126 and can process more instructions of code per second, a processing unit 114 comprising solely a DSP 128 would present the fastest solution.

Figure 2:
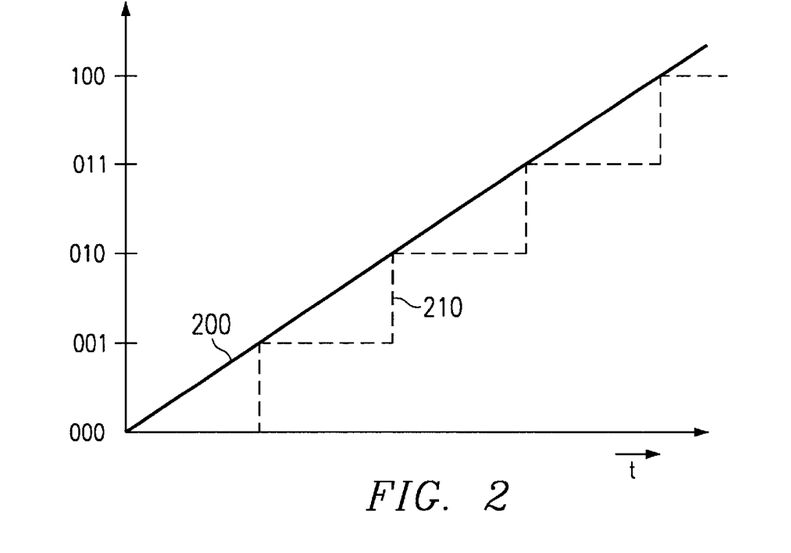
FIG. 2 shows an input signal for an analog-to-digital converter and the associated ideal response.
Figure 3:
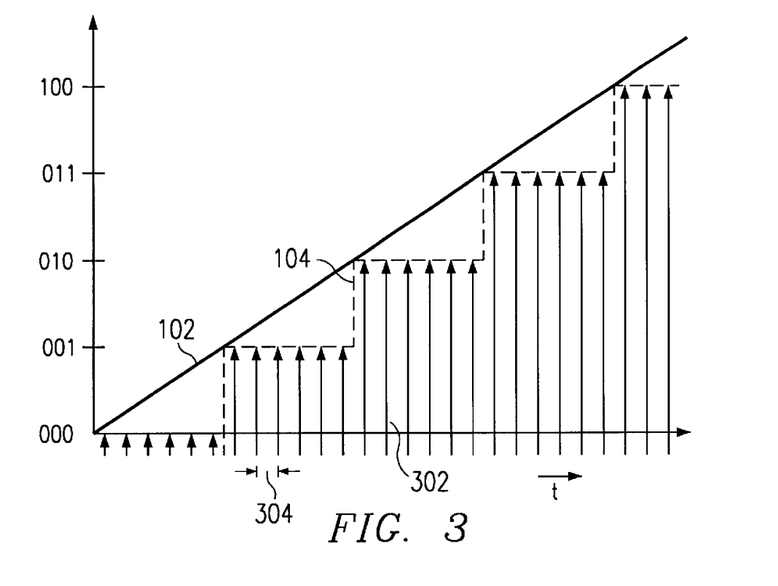
FIG. 3 shows sampled code word values of an analog-to-digital converter.

In an effort to demonstrate the data transfer sequence process in accordance with the present invention, a known sampling technique is reviewed using FIGS. 2 and 3. FIG. 2 displays a sample input signal 200 and an ideal resulting n-bit ADC code word 210. A typical test flow includes an analog level forced to an ADC input. The input signal 200, a voltage which increases linearly in time from a given minimum value to a given maximum value, is applied. As shown in FIG. 3, the ADC takes a sample of the input signal at given instants, represented by the arrows, and converts the sample into a code word on the outputs of the converter. The time, $\Delta t$, elapsing between two successive samples determines how often the ADC takes a sample of the input signal in conformity with the sampling frequency, $f_{sample}=1/\Delta t$. As explained in the background, in order to achieve accurate testing of the ADC with respect to the DNL and the INL, the number of samples per code word should be sufficiently large. A practical example involves the testing of a 12-bit ADC with a sampling frequency $f_{sample}$ of 400 KHz, the tester being arranged to take 64 samples per code word. Generally, the outputs of the ADC generate a signal which increases linearly in time in discrete steps, following the input signal. Each discrete step yields a digital code word. If the ADC is linear, the step sizes of all the codes will be equal, and each code will be present an equal number of times in the ADC output.

As opposed to conventional test systems, in a process according to the present invention, data transfer is performed in 3 stages. A first stage includes capturing only m least significant bits (LSBs) of the n bit ADC output. A second stage includes packing the least significant bits (LSBs) of k codes and moving them to the tester memory over a b-bit wide bus where $k = \lfloor b/m \rfloor$ and "$\lfloor \ \rfloor$" denotes truncation to the nearest integer. For example, if the bus is 16-bits wide and m=3, 5 codes are sent to the tester memory in one cycle and the memory transfer time is reduced to ⅕th. A third stage includes regenerating the actual n-bit ADC codes from the m LSBs of ADC output using the method displayed by the flowchart of FIG. 6 (which will be described in detail further in the specification). The computational overhead of the regeneration procedure is minimal which leads to a large saving in production test time of the ADC.

The derivation of the steps necessary for implementing the data transfer technique in accordance with the present invention are presented for clarity as follows. The original n-bit ADC output code word, I, can be expressed as the sum of two integers:

$$I = I_{mLSB} + I_{offset} \quad (1)$$

The first integer, $I_{mLSB}$, is the integer represented by the m-bit packet of least significant bits (LSBs) transferred to the tester memory 112. The second integer, $I_{offset}$, is an offset value that must be added the first integer, $I_{mLSB}$, to obtain the n-bit ADC output code word, I. The offset value, $I_{offset}$, is determined by acknowledging that there are $2^{n-m}$ such offsets, given by 0, $1 \times 2^m$, $2 \times 2^m$, $(2^{n-m}-1) \times 2^m$. If the last offset value, $(2^{n-m}-1) \times 2^m$, is added to $2^m-1$, the highest code of the n-bit ADC, $2^n-1$, is obtained. Assuming a ramp is used for an test signal, the method in accordance with the present invention takes advantage the aforementioned characteristics of the data to generate the offset value, $I_{offset}$, be to regenerate each n-bit ADC output code word from each m-bit LSB packet.

Figure 4:
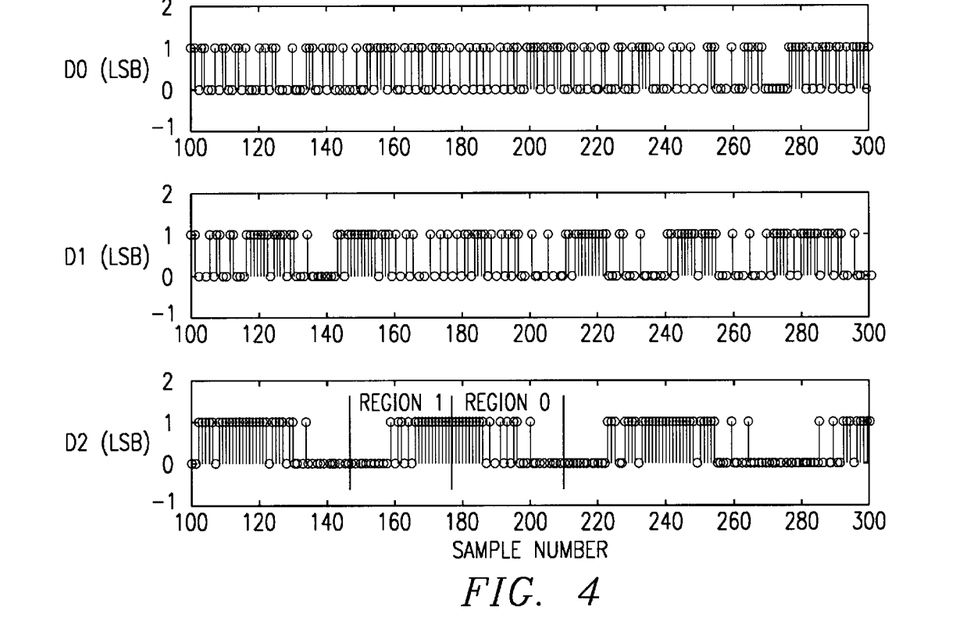
FIG. 4 illustrates the diagrams of a simulated output of the last three least significant bits of an 8-bit ADC with 4 LSB noise excited by a ramp with 8 samples/code having a 5 volt dynamic range, where the x-axis represents the number of samples and the y-axis represents the digital output.

FIG. 4 shows an example of the last 3 LSBs (m=3) sent to the tester memory for an 8-bit ADC (n=8) excited by a ramp input signal. The slope of the ramp is adjusted to get 8-samples/code on an average. Thus, in total, there are $2^8 \times 8 = 2048$ output samples. In FIG. 4, only the LSBs of the samples between 100 and 300 are shown. To model the random noise generated in an ADC circuit, a normally distributed noise signal with 3σ=4LSB is added to the ramp input. It can be seen that for bit D2 (3rd bit), the random noise is affecting only at the edges of the transition while other bits are completely corrupted by the noise. To obtain a considerable number of samples which are not affected by noise in the $m^{th}$ bit, at least one more bit above the noise level must be sent to the tester memory 112 of FIG. 1. Thus, the number of LSBs, m, is derived by the following equation:

$$m > \lceil \log_2(\text{Noise amplitude inherent in the device in terms of LSBs}) \rceil + 1 \quad (2)$$

where the symbol ⌈ ⌉ represents rounding down to the next integer. For an 8-bit ADC example, the number of LSBs, m>2+1=3. Experiments performed on a 12-bit ADC using the process in accordance with the present invention have shown that sending 4 bits to the tester memory (m=4) gave accurate INL and DNL values.

As shown in FIG. 4, a first and a second region, Region 1 and Region 0, are identified for the ADC output samples, respectively. These regions, Region 1 and 0, are identified by looking at the $m^{th}$ bit of the ADC. In Region 1, the $(m+1)^{th}$ bit of the ADC does not switch and hence the $I_{offset}$ is remains constant. In Region 0, however, the $(m+1)^{th}$ bit switches either from a value of "0" to "1" or a value of "1" to "0." Thus, the offset value, $I_{offset}$, can have two different values. However, the appropriate offset value, $I_{offset}$, can be identified by monitoring the $m^{th}$ bit in this region, Region 0.

Figure 5:
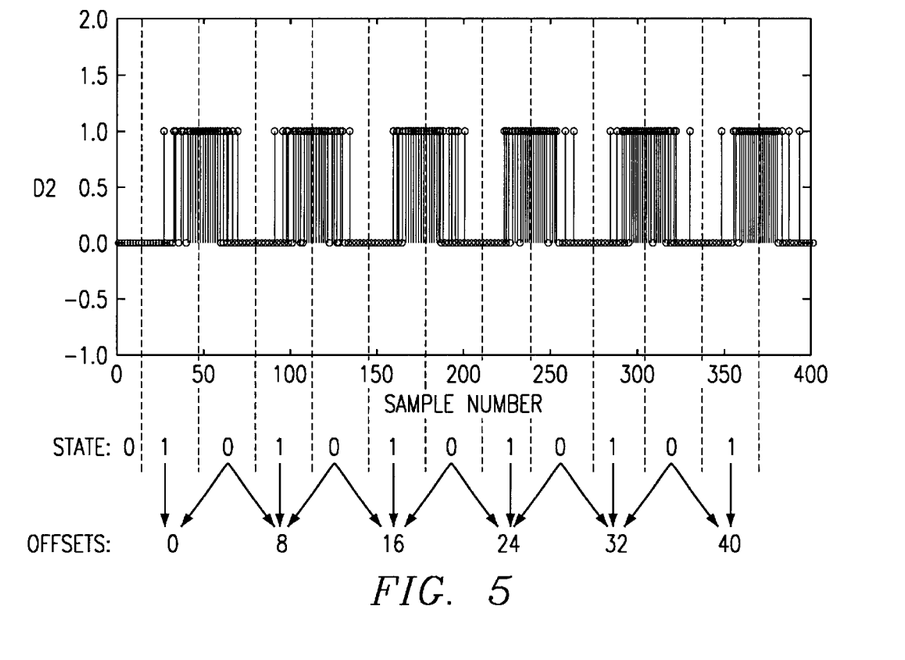
FIG. 5 is a diagram of a simulated output of the third least significant bit of an 8-bit ADC illustrating offset value relative to the state necessary to regenerate the original n-bit code word in accordance with the present invention.

As illustrated in FIG. 5, the $m^{th}$ bit or the third bit in this example is displayed. If the $m^{th}$ bit is a "1" for a sample in Region 0, the offset value, $I_{offset}$, for this sample is the same as that of Region 1. If the $m^{th}$ bit is a "0" for a sample in Region 0, the offset value is equivalent to $I_{offset}+2^m$. Each region, Region 1 and 0, is defined by the occurrence of R consecutive "1"s or "0"s on the $m^{th}$ bit of the ADC output. The value of R is used to regenerate the n-bit ADC code word and must be chosen based on the following equation:

$$R=(2^{m-1} \times \text{Average number of samples/code for an ideal } ADC)/4$$

Figure 6:
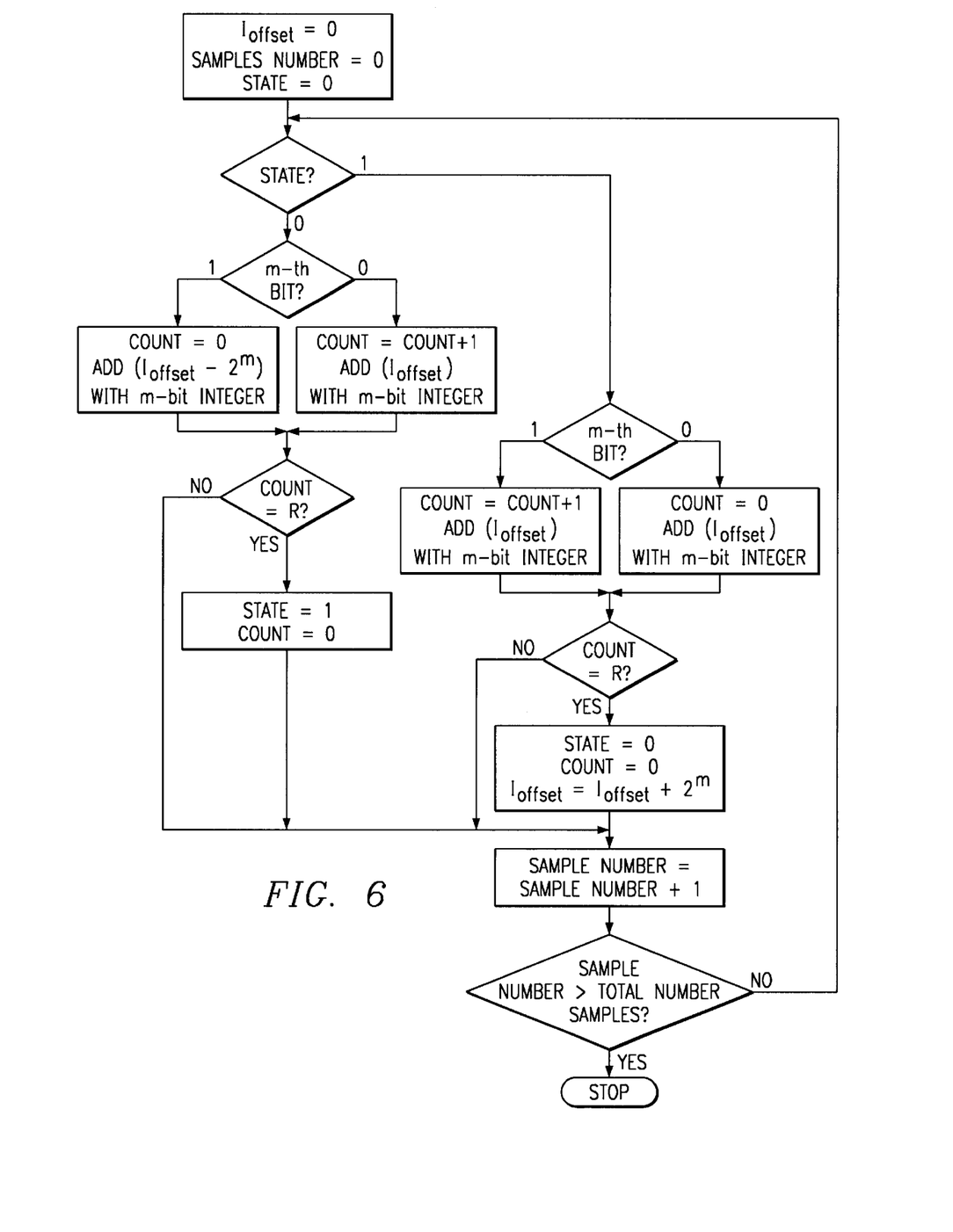
FIG. 6 is a flow chart of the method for adding the appropriate offset in accordance with the present invention.

As shown in FIG. 6, for identifying the appropriate offset value to be added to the m-bit packet, the method in accordance with the present invention initializes the offset value $I_{offset}$ to 0. When in state 0, depending on the $m^{th}$ bit, an offset value is added to the m-bit packet. If the $m^{th}$ bit is a "1," an offset value of $I_{offset}-2^m$ is added to the m-bit packet. If the $m^{th}$ bit is a "0," an offset value of $I_{offset}$ is added to the m-bit packet. The number of consecutive "0"s at the $m^{th}$ bit are counted. If the count exceeds a predetermined maximum count R, the state is changed to state 1 and the count for the number of consecutive values is reinitialized to 0. When in state 1, an offset value, $I_{offset}$ is always added to the m-bit packet. If the $m^{th}$ bit is a "1," the count of consecutive values is incremented by one. If the $m^{th}$ bit is a "0," the count of consecutive values is reinitialized to 0. The number of consecutive "1"s at the $m^{th}$ bit are counted. If the count exceeds a predetermined maximum count R, the state is changed to state 0 and the count for the number of consecutive values is reinitialized to 0. Additionally, as a result, the offset value, $I_{offset}$, is increased by $2^m$.

The previously described method in accordance with the present invention has the advantages including test time reduction and system cost savings. Using a 12-bit ADC such as model TLV2541 sold by Texas Instruments®, Inc. and an Advanced Mixed-Signal Test System such as the model A580 sold by TERADYNE®, Inc., the INL and DNL of the ADC was calculated for three different supply voltage conditions, yielding a test time saving of approximately 339.65 ms. The overall test time saving averaged over 317 test runs demonstrated that the conventional method lasts 196.28 msec, while the method in accordance with the present invention lasts 83.06 msec having an estimated savings in test time of 113.22 msec. The savings if the test were done at three different supply voltage conditions are 339.65 msec. In addition, if 32 samples are collected per code then the savings are 468.6 msec. Finally, the estimated savings for a 14-bit converter is 1.875 sec.

Examples of costs savings based upon projected test time savings for INL and DNL based on a ramp input with 32 samples/code show that test cost savings for a 12-bit ADC having a time savings of 496 ms is 2.48 cents/test, assuming 5 cents/second. The total test cost saving estimated for 1 million devices is $24,800. For a 14-bit ADC, the savings in testing time are approximately 1.876 s which translates into a test cost saving per device of 9.92 cents. Thus, the total test cost saving estimated for 1 million devices approximates to $99,200. Moreover, for a 16-bit ADC, the savings in testing time are approximately 7.504 sec which translates into a test cost saving per device of 39.68 cents. The total test cost saving estimated for 1 million devices is a substantial savings of $396,800.

Figure 7A:
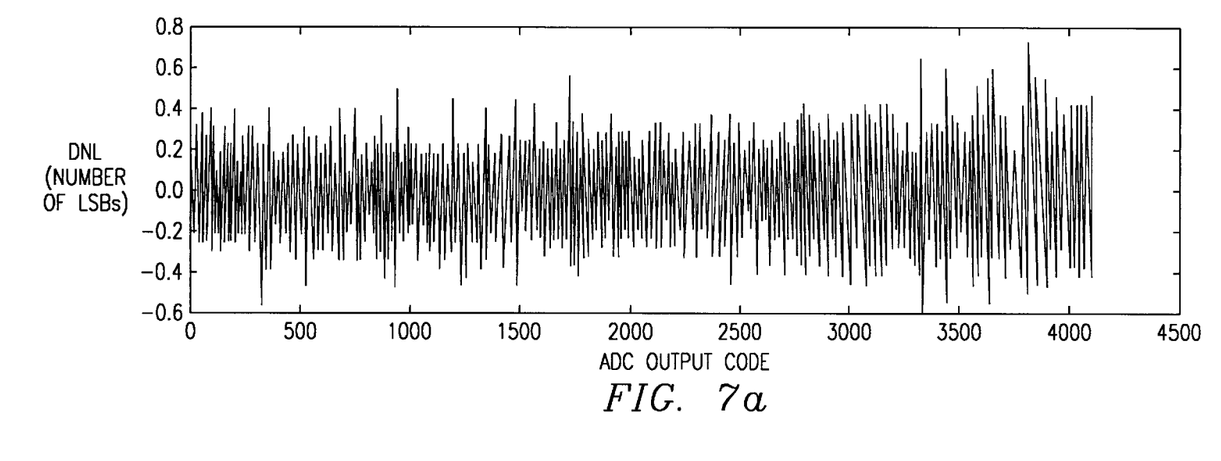
FIGS. 7a and 7b are diagrams of the DNL calculated in accordance with the present invention and in accordance with a known method, respectively.
Figure 7B:
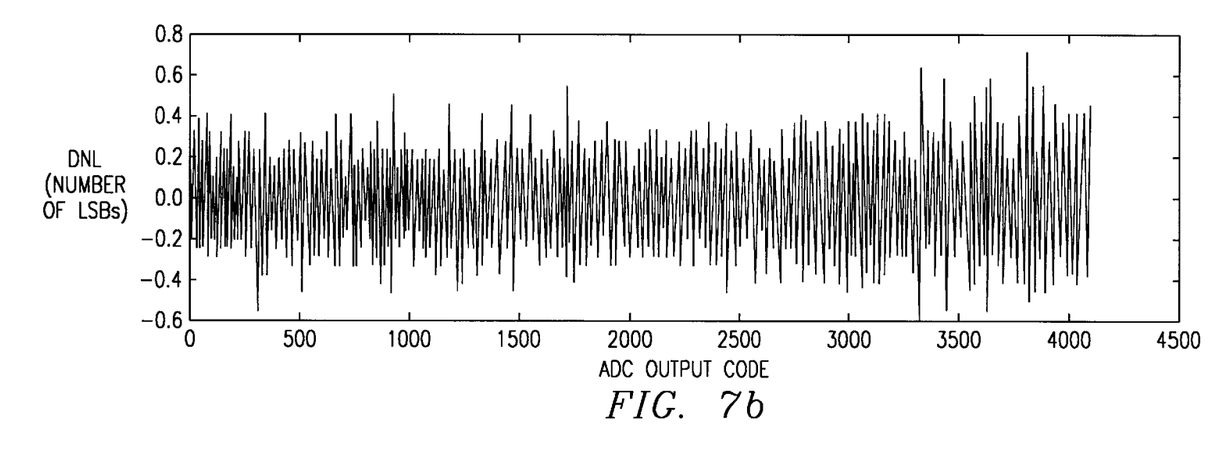

FIGS. 7(a) and (b) illustrates the DNL values obtained by the method in accordance with the present invention verses the convention method, respectively. As shown, there is little, if any, change in the calculated values of DNL which demonstrates that accuracy is not lost using the method and apparatus in accordance with the present invention.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A system for testing an analog-to-digital converter to generate characteristic parameters of the analog-to-digital converter, which comprises:
    (a) a handling device for placement of the analog-to-digital converter;
    (b) a communications channel coupled to the handling device;
    (c) a test body, having a plurality of test probes, for applying a sequence of vectors to the analog-to-digital converter, the test body coupled to the communications channel;
    (d) a computerized workstation coupled to the communications channel, the computerized workstation responsive user input;
    (e) a test mainframe coupled to the communications channel for processing of the plurality of n-bit code words;
    (f) the handling device responsive to the test mainframe to position the device under test to contact the plurality of test probes of the test body;
    (g) the test body responsive to the test mainframe to apply a plurality of test signals to the device under test, the analog-to-digital converter responsive to the plurality of test signals to generate a n-bit code word for each test signal; and
    (h) the test mainframe responsive to user input of the computerized workstation to generate a plurality of control signals to send a in-bit packet of least significant bits for each n-bit code word to the test mainframe, whereby the value m is proportional to the noise inherent in the system and m is less than n, the test mainframe responsive to each m-bit packet of least significant bits to regenerate the plurality of n-bit code words by determining an offset value to add to each in-bit packet, the test mainframe responsive to regenerated plurality of n-bit code words and predetermined criteria of operability to determine whether the analog-to-digital converter passes a level of functionality.

2. A system as recited in claim 1 wherein the test mainframe comprises:
    (a) a subsystem that establishes a process of determining the plurality of m least significant bits to transfer from the test body to the test mainframe;

(b) a tester storage means responsive to the plurality of m-bit packets sent from the test body;

(c) a subsystem that establishes a process of determining a plurality of k code words of the m-bit packets to transfer simultaneously in the communications channel from the test body to the tester storage means, where k equals the quotient of the width of the communications channel divided by m, whereby the quotient is rounded down to the nearest integer; and (d) a processing unit responsive to the plurality of k code words stored in the tester storage means to regenerate a plurality n-bit code words from each m-bit packet by determining an offset value to add to each m-bit packet; and the processing unit responsive to the regenerated n-bit code word for generating characteristic parameters of the device to determine whether the device passes a predetermined criteria of operability.

3. A system as recited in claim 2, wherein the processing unit includes:

(a) a tester central processing unit; and (b) a programmable storage device tangibly embodying a program of instructions executable by the tester central processing unit, to regenerate the n-bits converted digital code word from each m-bit code word by determining an offset value to add to the plurality of m least significant bits for each code word to obtain a regenerated n-bit digital code word.

4. A system as recited in claim 2, wherein the processing unit comprises (a) an initialization device for initializing to zero an offset value, $I_{offset}$, a count, s, representative of the number of samples, and a state value, S;

(b) a state determining device for determining the state value, whereby in a first state when the $m^{th}$ bit of the code word is one, the count, s, is set to 0 and the m-bit packet is added to the offset value of $I_{offset}-2^m$, whereby in the first state when the $m^{th}$ bit of the code word is zero, the count, s, is incremented by one and the m-bit packet is added to the offset value is set to the present value of $I_{offset}$, whereby in a second state when the $m^{th}$ bit is a one, the count, s, is incremented by one and the m-bit packet is added to the offset value is set to the present value of $I_{offset}$, and whereby in the second state when the $m^{th}$ bit is a zero, the count, s, is set to 0 and the m-bit packet is added to the offset value is set to the present value of $I_{offset}$;

(c) a count maximum determining device for comparing a maximum sample count, R, with the count, s, whereby in the first state when s equals R, the count, is reset to zero and the state value is set to the second state, whereby in the second state when s equals R the state value is set to the first state, the count, s, is reset to zero, and the offset value is incremented by $2^m$;

(d) a sample count incrementor for incrementing the count of samples, c; and (e) a comparator for comparing the sample count, c, with the total number of samples, C.

5. A method of a test system for determining whether a device under test is functioning properly, comprising:

(a) supplying a test signal to the device under test, the test signal varies in time and covers a given voltage range in order to form a series of successive code words, each of which comprises a plurality of n-bits, on outputs of the analog-to-digital converter;

(b) determining the value, m, indicative of a plurality of least significant bits proportional to the value of noise inherent in the system;

(c) storing the value, m, in a storage means;

(d) capturing a plurality of m least significant bits of the plurality of n digital bits generated from the device under test, where m least significant bits makes up a code word;

(e) transferring a plurality of k code words to a test memory along a bus having a bus width of b bits, where k equals the quotient of the bit-width of the bus divided by the number of least significant bits m rounded down to the nearest integer;

(f) decoding the plurality of k code words to regenerate the n-bit digital code word; and (g) calculating the parametric variables from the plurality of n-bit code words to determine whether the device under test passes a predetermined criteria of operability.

6. A method as recited in claim 5, wherein the decoding step comprises the steps of:

(a) capturing a value, r, indicative of the average number of samples per code for an ideal analog-to-digital converter from a user input means;

(b) storing the value, r, in a storage means;

(c) calculating a value, R, of the number of samples per sampling region, where:

$R=2^{m-1}r/4$;

(d) initializing a value for a offset value, $I_{offset}$, to zero, a value for number of samples, s, to zero and a value for number of state to zero;

(e) setting a value of count, c, to zero, setting the offset value $I_{offset}$ to $I_{offset}-2^m$, and adding the offset value, $I_{offset}$, to the m-bit code word only when the state is zero and the $m^{th}$ bit is one;

(f) incrementing the value of count, c, by one and adding the offset value, $I_{offset}$, to the m-bit code word only when the state is zero and the $m^{th}$ bit is zero;

(g) incrementing the value of count, c, by one and adding the offset value, $I_{offset}$, to the m-bit code word only when the state is one and the $m^{th}$ bit is one;

(h) setting a value of count, c, to zero and adding the offset value, $I_{offset}$, to the m-bit code word only when the state is one and the $m^{th}$ bit is zero;

(i) setting the state equal to one and the count equal to zero only when the state equals zero and the count, c, equals the value R;

(j) setting the state equal to zero, the count equal to zero, and the offset value $I_{offset}$ equal to $I_{offset}+2^m$ only when the state equals one and the count, c, equals the value R;

(k) incrementing the number of samples, s, by one; and (l) repeating steps a through k only when the number of samples, s, is less than a total number of samples, S.

7. A method as recited in claim 5, wherein the determining step for the value, m, of least significant bits to transfer includes capturing the value, m, from an user input means.

8. A method as recited in claim 5, wherein the determining step for the value, m, of least significant bits to transfer includes calculating the value, m, where:

$m>[\log_2(\text{average noise amplitude in terms of the plurality of least significant bits})]+1$.

9. A test system having a programmable storage device readable by a tester memory of test system, tangibly embodying a program of instructions executable by a tester central processing unit to perform method steps for transferring data from a test body in the test system to the tester memory and regenerating a n-bit code word produced by a device under test for further processing to calculate characteristic parameters for determining if the device under test meets a pre-determined level of operability, comprising the steps of:

(a) supplying an input of the analog-to-digital converter with a test signal which varies in time and covers a given voltage range in order to form a series of successive code words, each of which comprises a plurality of n bits, on outputs of the analog-to-digital converter;

(b) capturing the value of a number, m, indicative of a plurality of least significant bits proportional to the noise inherent in the test system;

(c) storing the value, m, in a storage means;

(d) capturing a plurality of m least significant bits of the plurality of n digital bits generated from the analog-to-digital converter, where m least significant bits makes up a code word;

(e) transferring a plurality of k code words to a test memory along a bus having a bus width of b bits, where k equals the quotient of the bit-width of the bus divided by the number of least significant bits m rounded down to the nearest integer;

(f) decoding the plurality of k code words into the plurality of n bit code words; and (g) calculating the parametric variables from the plurality of n-bit code words to determine whether the device under test passes a predetermined criteria of operability.

10. A method as recited in claim 9, wherein the determining step for the value, m, of least significant bits to transfer includes capturing the value, m, from an user input means.

11. A method as recited in claim 9, wherein the determining step for the value, m, of least significant bits to transfer includes calculating the value, m, where:

$$m > \lceil \log_2(\text{average noise amplitude in terms of the plurality of least significant bits}) \rceil + 1.$$

12. A method as recited in claim 9, wherein the decoding step comprises the steps of:

(a) capturing a value, r, indicative of the average number of samples per code for an ideal analog-to-digital converter from a user input means;

(b) storing the value, r, in a storage means;

(c) calculating a value, R, of the number of samples per sampling region, where:

$$R = 2^{m-1} r/4;$$

(d) initializing a value for a offset value, $I_{offset}$, to zero, a value for number of samples, s, to zero and a value for number of state to zero;

(e) setting a value of count, c, to zero, setting the offset value $I_{offset}$ to $I_{offset} - 2^m$, and adding the offset value, $I_{offset}$, to the m-bit code word only when the state is zero and the $m^{th}$ bit is one;

(f) incrementing the value of count, c, by one and adding the offset value, $I_{offset}$, to the m-bit code word only when the state is zero and the $m^{th}$ bit is zero;

(g) incrementing the value of count, c, by one and adding the offset value, $I_{offset}$, to the m-bit code word only when the state is one and the $m^{th}$ bit is one;

(h) setting a value of count, c, to zero and adding the offset value, $I_{offset}$, to the m-bit code word only when the state is one and the $m^{th}$ bit is zero;

(i) setting the state equal to one and the count equal to zero only when the state equals zero and the count, c, equals the value R;

(j) setting the state equal to zero, the count equal to zero, and the offset value $I_{offset}$ equal to $I_{offset} + 2^m$ only when the state equals one and the count, c, equals the value R;

(k) incrementing the number of samples, s, by one; and (l) repeating steps (a) through (k) only when the number of samples, s, is less than a total number of samples, S.

13. A computer-readable medium having stored thereon sequences of instructions which, when executed by a processor, cause the processor to perform the steps recited in claim 9.

14. A method for manufacturing an integrated circuit comprising the steps of:

(a) exciting a device under test with a plurality of test signal samples on a test system;

(b) retrieving an n-bit output data code word for each sample from the device under test responsive to the plurality of test signal samples;

(c) transferring a plurality of m least significant bit packets for each sample over an n-bit width communications channel to a processing unit, where n>m and m is proportional to the noise inherent in the test system;

(d) regenerating the n-bit output data code word for each sample from each m-bit packet of least significant bits by determining an offset value to add to the m-bit packet;

(e) calculating characteristic parameters from each n-bit output data code word;

(f) determining whether the device passes a predetermined criteria of operability by comparing the characteristic parameters with the predetermined criteria of operability; and (g) packaging the device under test.

* * * * *